United States Patent
Lee et al.

(10) Patent No.: US 11,204,204 B2
(45) Date of Patent: Dec. 21, 2021

(54) ACOUSTIC ABSORBER WITH INTEGRATED HEAT SINK

(71) Applicant: Toyota Motor Engineering & Manufacturing North America, Inc., Plano, TX (US)

(72) Inventors: Taehwa Lee, Ann Arbor, MI (US); Hideo Iizuka, Ann Arbor, MI (US); Ercan Mehmet Dede, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 86 days.

(21) Appl. No.: 16/296,412

(22) Filed: Mar. 8, 2019

(65) Prior Publication Data
US 2020/0284529 A1    Sep. 10, 2020

(51) Int. Cl.
*F28F 3/02*    (2006.01)
*F01N 1/02*    (2006.01)
(Continued)

(52) U.S. Cl.
CPC .................. *F28F 3/02* (2013.01); *F01N 1/02* (2013.01); *F01N 1/023* (2013.01); *F28F 3/04* (2013.01);
(Continued)

(58) Field of Classification Search
CPC ......... G10K 11/172; G10K 11/02; F28F 3/00; F28F 3/02; F28F 3/04; F28F 3/042;
(Continued)

(56) References Cited

U.S. PATENT DOCUMENTS

| 2,548,485 A | * | 4/1951 | Lubbock | ................. F23R 3/007 432/238 |
| 2,855,039 A | * | 10/1958 | Gross | .................... E04B 1/8209 160/236 |

(Continued)

FOREIGN PATENT DOCUMENTS

| EP | 3242105 A1 | * | 11/2017 | ................. F02C 3/04 |
| EP | 3557571 A1 | * | 10/2019 | ............. B64D 33/02 |

(Continued)

OTHER PUBLICATIONS

"Ultrasparse Acoustic Absorbers Enabling Fluid FLow and Visible Light Controls" (Year: 2019).*
(Continued)

*Primary Examiner* — Len Tran
*Assistant Examiner* — Jenna M Hopkins
(74) *Attorney, Agent, or Firm* — Christopher G. Darrow; Darrow Mustafa PC

(57) ABSTRACT

A thermal management assembly is provided for both removing heat and absorbing acoustic energy. The thermal management assembly includes a heat sink base component and a plurality of thermally conductive fins disposed in a sparsely-arranged array in thermal communication with the heat sink base component. Each fin defines a two-sided Helmholtz unit cell disposed in a periodic array extending from the heat sink base component. Each unit cell includes a lossy resonator and a lossless resonator. The lossy resonator includes a first chamber portion bounded by at least one first boundary wall defining a first chamber volume, and a first neck forming an opening in the first chamber portion. The lossless resonator includes a second chamber portion bounded by at least one second boundary wall defining a second chamber volume, and a second neck forming an opening in the second chamber portion.

20 Claims, 11 Drawing Sheets

(51) Int. Cl.
*F28F 3/04* (2006.01)
*F28D 21/00* (2006.01)
*F01N 3/02* (2006.01)
*F01N 3/04* (2006.01)
*G10K 11/172* (2006.01)

(52) U.S. Cl.
CPC ........ *F01N 3/02* (2013.01); *F01N 3/04* (2013.01); *F28D 2021/0029* (2013.01); *F28F 3/042* (2013.01); *F28F 3/046* (2013.01); *F28F 2215/06* (2013.01); *F28F 2265/28* (2013.01); *G10K 11/172* (2013.01)

(58) Field of Classification Search
CPC ..... F28F 3/046; F28F 2265/28; F28F 2265/30; F28F 2270/00; F28F 2215/06; F28D 9/00; F28D 9/0012; F28D 9/0018; F01N 1/02; F01N 3/02; F01N 3/04
USPC ....... 181/224, 250, 241, 271, 277, 145, 148, 181/153, 199, 206, 219, 225, 226, 232; 381/354, 353, 715, 731; 165/12
See application file for complete search history.

(56) References Cited

U.S. PATENT DOCUMENTS

| | | | | |
|---|---|---|---|---|
| 3,033,307 A * | 5/1962 | Sanders | ............... | F01N 1/24 181/224 |
| 3,887,031 A * | 6/1975 | Wirt | ............... | E04B 1/86 181/286 |
| 4,150,732 A * | 4/1979 | Hoch | ............... | F02C 7/24 181/213 |
| 4,231,447 A * | 11/1980 | Chapman | ............... | F01N 1/02 181/213 |
| 4,330,047 A * | 5/1982 | Ruspa | ............... | F24F 13/08 181/224 |
| 4,336,863 A * | 6/1982 | Satomi | ............... | F24F 13/24 181/224 |
| 4,606,305 A * | 8/1986 | Campen | ............... | F02P 1/08 123/149 D |
| 5,373,695 A | 12/1994 | Aigner et al. | | |
| 5,456,082 A * | 10/1995 | Keolian | ............... | F02G 1/0435 62/6 |
| 5,561,984 A * | 10/1996 | Godshalk | ............... | F02G 1/053 257/E23.096 |
| 5,869,792 A * | 2/1999 | Allen | ............... | F01D 25/30 181/224 |
| 6,051,913 A | 4/2000 | King | | |
| 6,128,188 A * | 10/2000 | Hanners | ............... | H01L 23/34 361/694 |
| 6,631,756 B1 * | 10/2003 | Hegde | ............... | H01L 23/467 165/121 |
| 6,644,388 B1 * | 11/2003 | Kilmer | ............... | F28F 1/10 165/109.1 |
| 6,729,383 B1 * | 5/2004 | Cannell | ............... | F28F 3/022 165/185 |
| 6,896,095 B2 * | 5/2005 | Shah | ............... | F01P 5/06 181/198 |
| 7,019,424 B2 * | 3/2006 | Aeschlimann | ...... | H02K 11/046 310/52 |
| 7,080,514 B2 * | 7/2006 | Bland | ............... | F23M 20/005 181/213 |
| 7,182,124 B2 * | 2/2007 | Chen | ............... | H01L 23/467 165/185 |
| 7,235,914 B2 * | 6/2007 | Richards | ............... | F02B 75/34 310/324 |
| 7,249,934 B2 * | 7/2007 | Palmer | ............... | F01D 5/186 416/97 R |
| 7,333,332 B2 * | 2/2008 | Wang | ............... | H01L 23/427 165/121 |
| 7,513,298 B2 * | 4/2009 | Tsai | ............... | H01L 23/367 165/185 |
| 7,607,287 B2 * | 10/2009 | Reba | ............... | F01D 9/02 415/115 |
| 7,623,348 B2 * | 11/2009 | Otsuki | ............... | H01L 23/3672 165/121 |
| 7,800,895 B2 * | 9/2010 | Inoue | ............... | G06F 1/20 361/679.34 |
| 7,810,552 B2 * | 10/2010 | Slaughter | ............... | F28F 3/048 165/148 |
| 7,817,425 B2 * | 10/2010 | Jeong | ............... | H05K 7/20963 361/704 |
| 7,819,221 B1 * | 10/2010 | Lane | ............... | B64G 1/38 181/206 |
| 7,891,410 B1 * | 2/2011 | Monson | ............... | H01L 23/467 165/80.2 |
| 7,913,813 B1 * | 3/2011 | Mathur | ............... | G10K 11/172 181/290 |
| 7,916,485 B2 * | 3/2011 | Yu | ............... | F28F 3/02 361/710 |
| 8,069,910 B2 | 12/2011 | Beltran et al. | | |
| D673,124 S * | 12/2012 | Lin | ............... | D13/179 |
| 8,376,031 B2 * | 2/2013 | Yang | ............... | H01L 23/467 165/80.3 |
| 8,408,281 B2 * | 4/2013 | Hamstra | ............... | B64D 13/00 165/44 |
| 8,418,804 B1 * | 4/2013 | Hawwa | ............... | F01N 1/161 181/224 |
| 8,485,310 B2 * | 7/2013 | Tanabe | ............... | H05K 7/20718 181/225 |
| 8,573,356 B1 * | 11/2013 | Perdue | ............... | G10K 11/16 181/284 |
| 8,596,050 B2 * | 12/2013 | Gerlach | ............... | F01N 5/02 60/322 |
| 8,635,874 B2 * | 1/2014 | Eroglu | ............... | F23R 3/002 60/725 |
| 8,667,949 B2 * | 3/2014 | Mizuguchi | ............ | F02M 35/088 123/198 E |
| 8,714,302 B2 * | 5/2014 | Gradinger | ............... | F28F 13/06 181/225 |
| 8,951,181 B2 * | 2/2015 | Burns | ............... | B04B 9/02 494/14 |
| 9,022,726 B2 * | 5/2015 | Szwedowicz | ............ | F01D 5/187 415/115 |
| 9,252,073 B2 * | 2/2016 | Yamashita | ............... | H01L 23/467 |
| 9,303,588 B2 * | 4/2016 | Pongratz | ............... | F02K 1/827 |
| 9,478,479 B2 * | 10/2016 | Arik | ............... | B23P 15/26 |
| 9,554,422 B2 * | 1/2017 | Coursey | ............... | F25B 29/00 |
| 9,599,410 B2 * | 3/2017 | Antel, Jr. | ............... | F28F 13/003 |
| 9,801,306 B2 * | 10/2017 | Siracki | ............... | B23P 15/26 |
| 9,988,958 B2 * | 6/2018 | You | ............... | F23R 3/00 |
| 10,103,089 B2 * | 10/2018 | Kaslusky | ............... | H01L 23/467 |
| 10,450,912 B2 * | 10/2019 | Donnelly | ............... | F01N 1/083 |
| 10,458,336 B2 * | 10/2019 | Pastouchenko | ......... | F01D 25/24 |
| 10,458,589 B2 * | 10/2019 | Hill | ............... | F01N 1/10 |
| 10,577,791 B2 * | 3/2020 | Hakuta | ............... | E04B 1/8404 |
| 10,626,886 B2 * | 4/2020 | McNair | ............... | F01N 1/02 |
| 2002/0018717 A1 * | 2/2002 | Dailey | ............... | F01D 5/187 416/97 R |
| 2003/0192737 A1 * | 10/2003 | Han | ............... | F22B 1/1815 181/224 |
| 2004/0228781 A1 * | 11/2004 | Tonkovich | ............ | B01J 19/0093 422/222 |
| 2005/0076668 A1 * | 4/2005 | Choi | ............... | E04F 17/04 62/404 |
| 2005/0098379 A1 * | 5/2005 | Sato | ............... | B60R 13/0815 181/293 |
| 2005/0161280 A1 * | 7/2005 | Furuya | ............... | F01N 1/003 181/225 |
| 2006/0042782 A1 * | 3/2006 | Chen | ............... | H01L 23/467 165/80.3 |
| 2007/0045044 A1 * | 3/2007 | Sullivan | ............... | F01N 1/083 181/268 |
| 2007/0119575 A1 * | 5/2007 | Glezer | ............... | H01L 23/427 165/104.33 |
| 2007/0163763 A1 * | 7/2007 | Tsai | ............... | H01L 23/367 165/135 |

(56) References Cited

U.S. PATENT DOCUMENTS

| | | | |
|---|---|---|---|
| 2007/0227711 A1* | 10/2007 | Furuya | H01L 23/427 165/135 |
| 2008/0123270 A1* | 5/2008 | Kim | H05K 7/20963 361/679.01 |
| 2008/0223551 A1* | 9/2008 | Otsuki | H01L 23/467 165/80.3 |
| 2009/0038883 A1* | 2/2009 | Kim | E04B 1/86 181/291 |
| 2009/0073656 A1* | 3/2009 | Otsuki | H01L 23/467 361/697 |
| 2009/0097972 A1* | 4/2009 | Murphy | F02C 7/224 415/178 |
| 2009/0218079 A1* | 9/2009 | Watanabe | H01L 23/467 165/121 |
| 2009/0317238 A1* | 12/2009 | Wood | F01D 9/065 415/119 |
| 2009/0321056 A1* | 12/2009 | Ran | H01L 23/467 165/104.34 |
| 2010/0078258 A1* | 4/2010 | Tanabe | G10K 11/172 181/224 |
| 2010/0155016 A1* | 6/2010 | Wood | F01D 25/12 165/51 |
| 2010/0282456 A1* | 11/2010 | Benignos | F28F 1/36 165/182 |
| 2011/0100748 A1* | 5/2011 | Nonogi | B32B 23/10 181/291 |
| 2011/0132573 A1* | 6/2011 | Liu | H01L 23/467 165/68 |
| 2011/0139429 A1* | 6/2011 | Salapakkam | H01L 23/467 165/185 |
| 2011/0318191 A1* | 12/2011 | Szwedowicz | F01D 5/187 416/97 R |
| 2012/0114468 A1* | 5/2012 | Elder | F02K 3/115 415/178 |
| 2012/0198854 A1* | 8/2012 | Schilp | F23R 3/002 60/755 |
| 2012/0205070 A1* | 8/2012 | Kamiya | F04D 29/681 165/96 |
| 2012/0279696 A1* | 11/2012 | Hsu | F28F 7/00 165/185 |
| 2014/0027102 A1* | 1/2014 | Antel, Jr. | F28F 3/048 165/185 |
| 2014/0116651 A1* | 5/2014 | Tong | F28F 3/025 165/104.19 |
| 2014/0138067 A1* | 5/2014 | Yamashita | H01L 23/467 165/121 |
| 2015/0176269 A1* | 6/2015 | Kang | E04B 1/8209 181/292 |
| 2015/0208547 A1* | 7/2015 | Gonzalez | H01L 23/467 165/80.3 |
| 2015/0241838 A1* | 8/2015 | Ishida | G10K 15/04 399/91 |
| 2016/0063984 A1* | 3/2016 | Kosonen | C08K 7/02 252/62 |
| 2016/0230778 A1* | 8/2016 | Mekid | G10K 11/172 |
| 2016/0265214 A1* | 9/2016 | Van Dinther et al. | G10K 11/172 |
| 2017/0022861 A1* | 1/2017 | Donnelly | F01N 1/08 |
| 2017/0263235 A1* | 9/2017 | Elford | G10K 11/172 |
| 2017/0276397 A1* | 9/2017 | Mouratidis | F24F 13/08 |
| 2017/0314433 A1* | 11/2017 | You | F01N 1/02 |
| 2017/0328280 A1* | 11/2017 | Hussain | F02C 7/185 |
| 2019/0390911 A1* | 12/2019 | Bunch | F28C 3/08 |
| 2020/0005756 A1* | 1/2020 | Lee | G10K 11/172 |

FOREIGN PATENT DOCUMENTS

| | | | | |
|---|---|---|---|---|
| WO | 2015022222 A1 | 2/2019 | | |
| WO | WO-2019208727 A1 * | 10/2019 | | G10K 11/172 |

OTHER PUBLICATIONS

Cai et al., "Acoustic performance of different Helmholtz resonator array configurations," Applied Acoustics, vol. 130, pp. 204-209 (2018).

Cheng et al., "Ultra-sparse metasurface for high reflection of low-frequency sound based on artificial Mie resonances," Nature Materials, vol. 14, pp. 1013-1020 (2015).

U.S. Appl. No. 16/296,403, filed Mar. 8, 2019 (not yet published).
U.S. Appl. No. 16/227,345, filed Dec. 20, 2018 (not yet published).
U.S. Appl. No. 15/962,513, filed Apr. 25, 2018 (not yet published); and.
U.S. Appl. No. 16/025,630, filed Jul. 2, 2018 (not yet published).

* cited by examiner

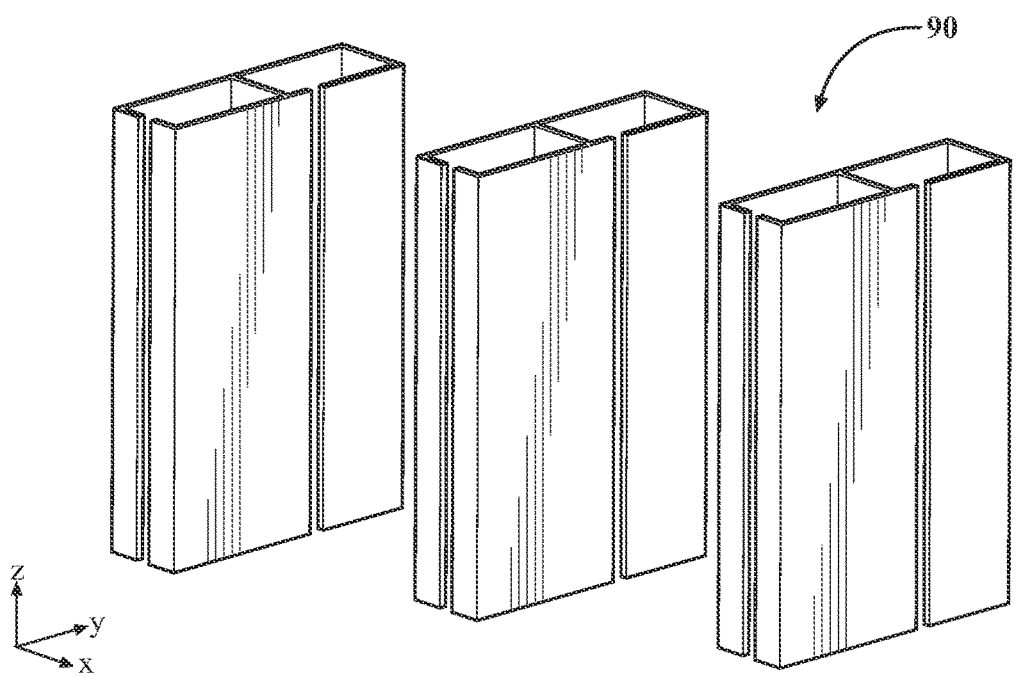
FIG. 11
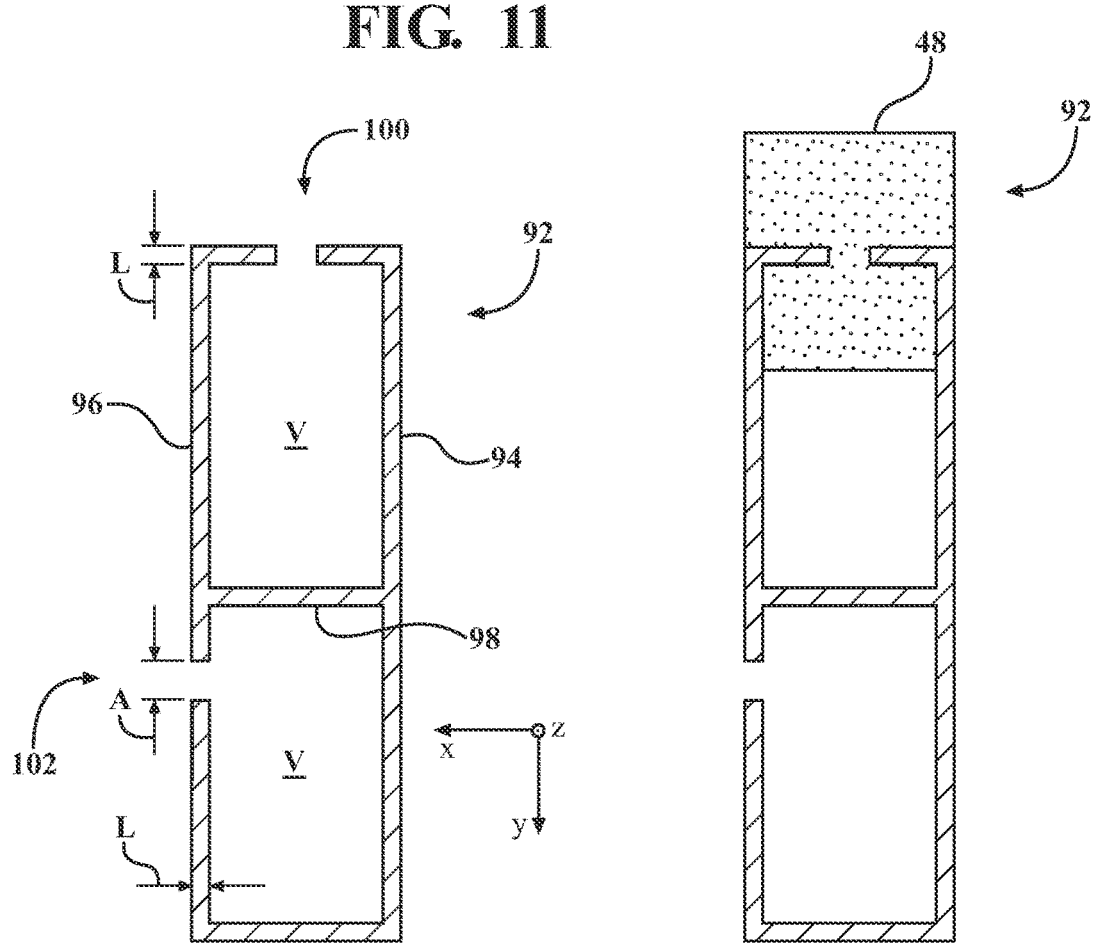
FIG. 12A
FIG. 12B

ACOUSTIC ABSORBER WITH INTEGRATED HEAT SINK

TECHNICAL FIELD

The present disclosure generally relates to acoustic metamaterials and, more particularly, to acoustic absorption metamaterials and assemblies that can additionally serve as a heat sink.

BACKGROUND

The background description provided herein is for the purpose of generally presenting the context of the disclosure. Work of the presently named inventors, to the extent it may be described in this background section, as well as aspects of the description that may not otherwise qualify as prior art at the time of filing, are neither expressly nor impliedly admitted as prior art against the present technology.

Heat sinks are commonly used to remove heat from various devices, including electronic components and power electronics devices, such as semiconductors and the like. While the sizes of such power electronic devices continue to decrease, the spaces for their placement are often limited. Conventional heat sinks are designed and used for thermal management. Heat sinks used for the cooling of electronic components and power electronics devices often create noise issues because they are combined with air cooling in order to address high heat fluxes. In such arrangements, noises may be generated by air circulation devices, such as rotating fans creating a cooling air/fluid flow. In order to address and minimize noise issues, acoustic absorbers are needed that do not compromise fluid flows.

Accordingly, it would be desirable to provide an improved heat sink system having the necessary thermal management, while minimizing noises that may be generated by air circulation devices creating air/fluid flow used in combination with the heat sink system.

SUMMARY

This section provides a general summary of the disclosure, and is not a comprehensive disclosure of its full scope or all of its features.

In various aspects, the present teachings provide a thermal management assembly for removing heat and absorbing acoustic energy. The thermal management assembly includes a heat sink base component and a plurality of thermally conductive fins disposed in a sparsely-arranged periodic array in thermal communication with, and extending from, the heat sink base component. Each fin defines a two-sided Helmholtz unit cell that includes a lossy resonator and a lossless resonator. The lossy resonator includes a first chamber portion bounded by at least one first boundary wall defining a first chamber volume, and a first neck forming an opening in the first chamber portion. The first neck provides fluid communication between the first chamber portion and an ambient environment. The lossless resonator includes a second chamber portion bounded by at least one second boundary wall defining a second chamber volume, and a second neck forming an opening in the second chamber portion. The second neck provides fluid communication between the second chamber portion and the ambient environment. In various aspects, the plurality of sparsely-arranged two-sided Helmholtz unit cells are positioned in a circular pattern with the first necks of the lossy resonators directed to a source of acoustic energy from the air circulation device.

In other aspects, the present teachings provide a thermal management assembly for removing heat and absorbing acoustic energy. The thermal management assembly includes a heat sink base component defining first and second opposing major surfaces. A heat generating device is provided in thermal communication with the first major surface. A plurality of thermally conductive fins are provided, disposed in a sparsely-arranged periodic array in thermal communication with the heat sink base component and extending from the second major surface. Each fin defines a two-sided Helmholtz unit cell that includes a lossy resonator and a lossless resonator. The lossy resonator includes a first chamber portion bounded by at least one first boundary wall defining a first chamber volume, and a first neck forming an opening in the first chamber portion. The first neck provides fluid communication between the first chamber portion and an ambient environment. The lossless resonator includes a second chamber portion bounded by at least one second boundary wall defining a second chamber volume, and a second neck forming an opening in the second chamber portion. The second neck provides fluid communication between the second chamber portion and the ambient environment.

In still other aspects, the present teachings provide a method of removing heat from a heat generating device and suppressing sound from an air circulation device. The method includes positioning a heat sink adjacent a heat generating device. The heat sink includes a base component with a plurality of thermally conductive fins extending therefrom in a sparsely-arranged periodic array. Each fin includes a two-sided Helmholtz unit cell that includes a lossy resonator directed to a source of acoustic energy from the air circulation device, and a lossless resonator. The lossy resonator includes a first chamber portion bounded by at least one first boundary wall defining a first chamber volume, and a first neck forming an opening in the first chamber portion. The first neck provides fluid communication between the first chamber portion and an ambient environment. The lossless resonator includes a second chamber portion bounded by at least one second boundary wall defining a second chamber volume, and a second neck forming an opening in the second chamber portion. The second neck provides fluid communication between the second chamber portion and the ambient environment. The method includes directing an airflow from the air circulation device to the respective first necks of the lossy resonators to remove heat from the heat generating device and absorb acoustic energy from the air circulation device. In various aspects, the fins may be disposed in an annular periodic array, and directing the airflow from the air circulation device to the respective first necks of the lossy resonators comprises aligning an airflow from a fan with the heat sink.

Further areas of applicability and various methods of enhancing the disclosed technology will become apparent from the description provided herein. The description and specific examples in this summary are intended for purposes of illustration only and are not intended to limit the scope of the present disclosure.

BRIEF DESCRIPTION OF THE DRAWINGS

The present teachings will become more fully understood from the detailed description and the accompanying drawings, wherein:

FIG. 11 illustrates a plurality of unit cells having a first alternate geometric design;

FIGS. 12A-12B are magnified cross-section views of a unit cell of FIG. 11 according to two aspects, with and without an acoustically absorbing medium;

It should be noted that the figures set forth herein are intended to exemplify the general characteristics of the methods, algorithms, and devices among those of the present technology, for the purpose of the description of certain aspects. These figures may not precisely reflect the characteristics of any given aspect, and are not necessarily intended to define or limit specific embodiments within the scope of this technology. Further, certain aspects may incorporate features from a combination of figures.

DETAILED DESCRIPTION

The present technology provides broadband sparse acoustic absorption structures arranged for use as both fins for a heat sink and as sound suppression unit cell structures for absorbing acoustic energy from an air circulation device, such as a fan, and the like. For example, the various assemblies disclosed herein include fins that are shaped as two-sided Helmholtz unit cells disposed in arrangements having a sparse periodic array, with open space between adjacent unit cells, thus allowing cooling air/fluid to flow freely between unit cells and through the assemblies. The design of the unit cell structure enables it to exhibit very broadband acoustic absorption that is tunable to a desired frequency range with minimal interruption of passing fluid flow. The material of the unit cell enables it to transfer heat away from a heat generating device.

Different periodic arrays of the unit cells can be provided in different frequencies, for example, as high frequency, intermediate frequency, and low frequency rows, enhancing the frequency range of high efficiency absorption. The fins, designs, and arrangements of the present technology have unique applicability in any application that can benefit from the combination of heat transfer and sound dampening with respect to an air circulation device, while allowing air or other gaseous fluid to pass freely through for cooling or other purposes.

Figure 1:
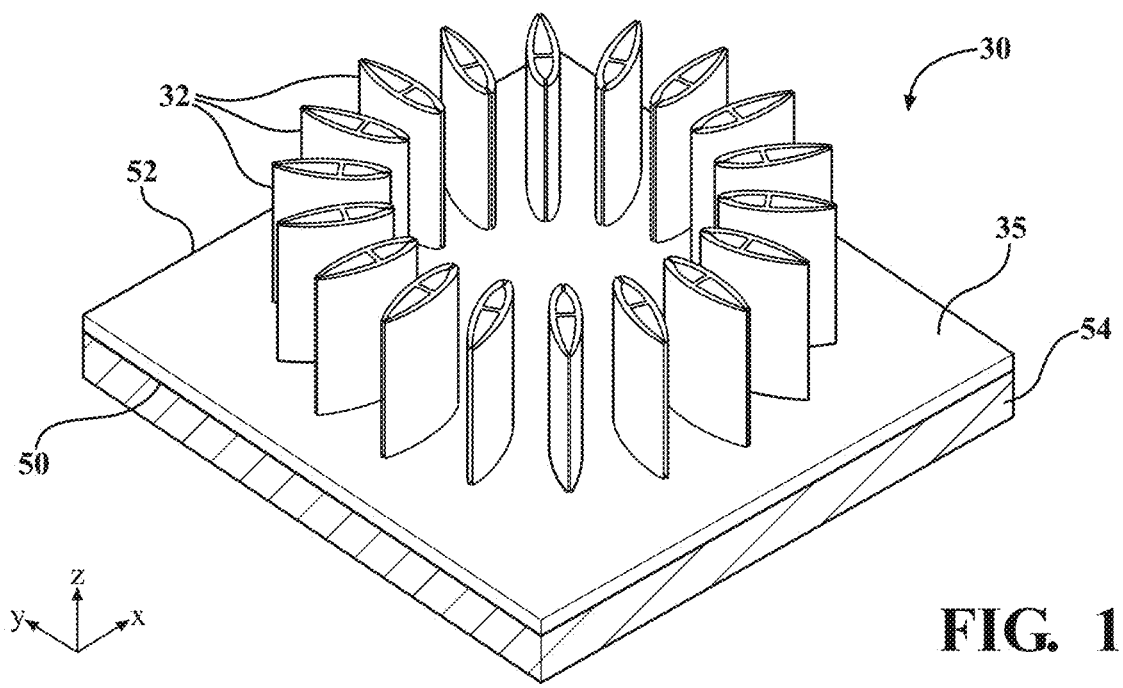
FIG. 1 is a top perspective view of an exemplary assembly with a heat generating device adjacent a heat sink that includes a periodic array of broadband sparse acoustic absorbers.
Figure 2:
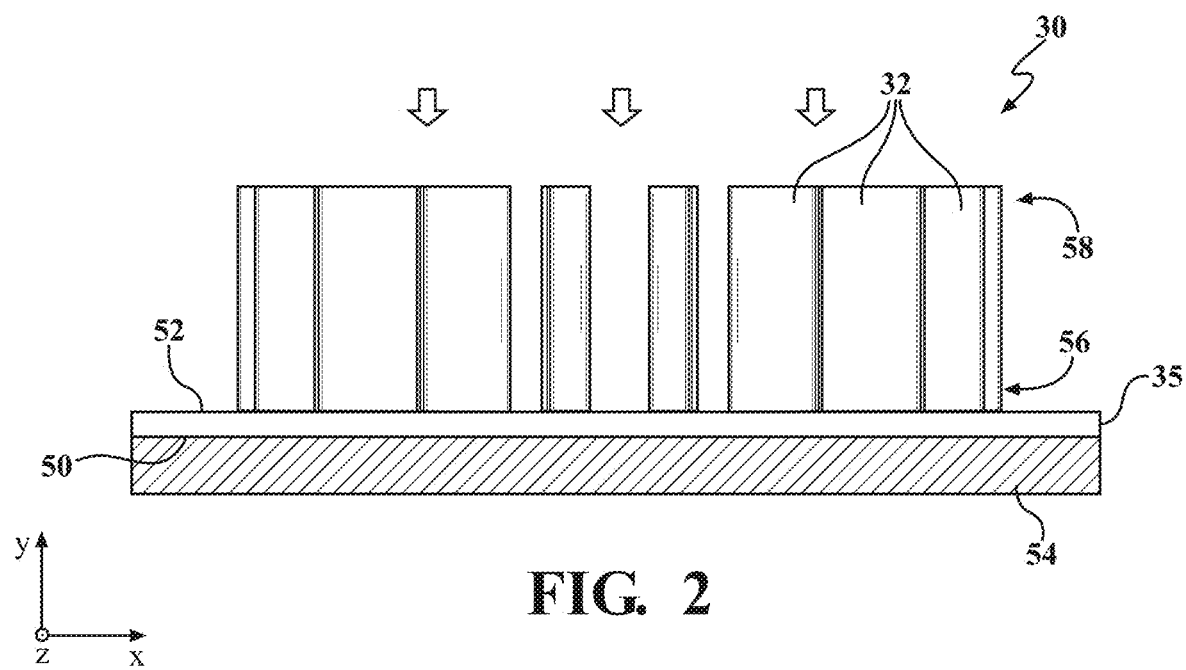
FIG. 2 is a side perspective view of FIG. 1.
Figure 3:
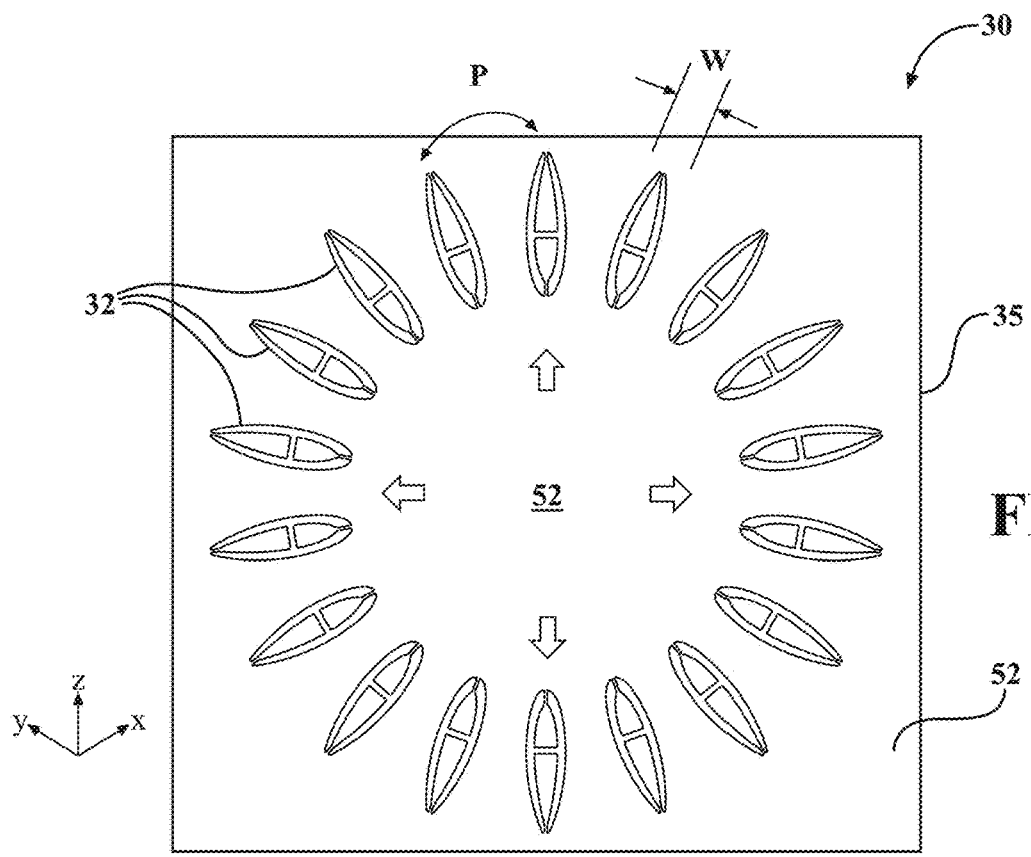
FIG. 3 is a top plan view of FIG. 1.

FIG. 1 is a top perspective view of a thermal management assembly 30 for removing heat and absorbing acoustic energy according to various aspects of the present technology. FIG. 2 is a side perspective view of FIG. 1, and FIG. 3 is a top plan view of FIG. 1, both FIGS. 2-3 are provided with arrows further illustrating a direction of acoustic energy, as well as airflow. In the example shown, the assembly 30 includes a heat sink base component 35 provided defining first and second opposing major surfaces 50, 52. As best illustrated in FIG. 2, a source of heat, such as a heat generating device 54 may be provided adjacent to, or at least in thermal communication with, the first major surface 50. The assembly 30 includes a plurality of thermally conductive fins 32 that may be disposed in a sparsely-arranged periodic array. The fins 32 have a unique dual functionality, and serve as both heat transfer devices and as an array of broadband sparse acoustic absorbers. The fins 32 are in thermal communication with the heat sink base component 35, and as shown, may extend in a substantially perpendicular direction from a first end 56 adjacent the second major surface 52 of the heat sink base component 35 to a second end 58 opposite the first end 56. Each fin 32 disclosed herein is provided as a two-sided Helmholtz unit cell, and may be referred to herein either as a fin or as a unit cell.

In various aspects, the heat generating device 54 may be a heat generating electronics component. As used herein, the broad term "electronics component" is not meant to be limiting and can include various electronic circuits, integrated circuits, power semiconductors, power electronic devices, and silicon-containing devices and chips as are known in the art. Generally, an electronics component can be any basic or discrete device for use in an electronic system used to affect electrons and/or their associated fields. As non-limiting examples, the electronics component can be part of a computing device, work station, data center, etc. It may also be part of a machine or apparatus, such as a vehicle. The electronics component can also include any number of leads, lead wires, or electrical terminals; it can be active, passive, or electromagnetic. In various aspects, the electronics component may be an insulated-gate bipolar transistor (IGBT) or a wideband gap semiconductor (WBG) widely used in hybrid, electric, and fuel cell vehicles. In certain aspects, the electronics component may include silicon as a power semiconductor material. In other aspects, silicon carbide and gallium nitride may be more suitable for power semiconductor devices such as those needed by electric vehicles. The heat generating device 54 may be provided with any shape, size, and dimensions suitable for the ultimate purpose and intended use.

As shown in FIGS. 1-3, the fins 32 of the thermal management assembly 30 can be positioned periodically in a circular or annular pattern on the heat sink base component 35. In certain aspects, they can be shaped as a wall or portion of a shaped enclosure disposed about an air circulation device (not shown). Although illustrated as a solid component, in various aspects, the heat sink base component 35 may be porous, in whole or in part, through which ambient fluid can pass with little constraint. Non-limiting examples of such a porous heat sink base component 35 can include a thermally conductive mesh or screen, a sheet of metal or other thermally conductive material having periodic apertures or perforations, or any other suitable substrate. The fins 32 can be joined or coupled in place to the heat sink base component 35 using various known joining and fastening techniques, such as using an adhesive, mechanical fastener, or using a welding technique, depending on the material of the fins 32 and the heat sink base component 35. In various aspects, the heat sink base component 35 and the plurality of fins 32 may be formed as a unitary, monolithic component. In one example, the heat sink base component 35 and the plurality of fins 32 can be made using additive manufacturing or 3-D printing techniques, and can be made of a metal or suitable thermally conductive material. In certain aspects, graphite may be useful as a material for the heat sink base component 35 and/or the fins 32. In other aspects, molding and extrusion techniques may be used. In non-limiting aspects, molding and extrusion may be useful with thermally conductive plastics, for example, polymers with thermally conductive fillers.

Figure 4A:
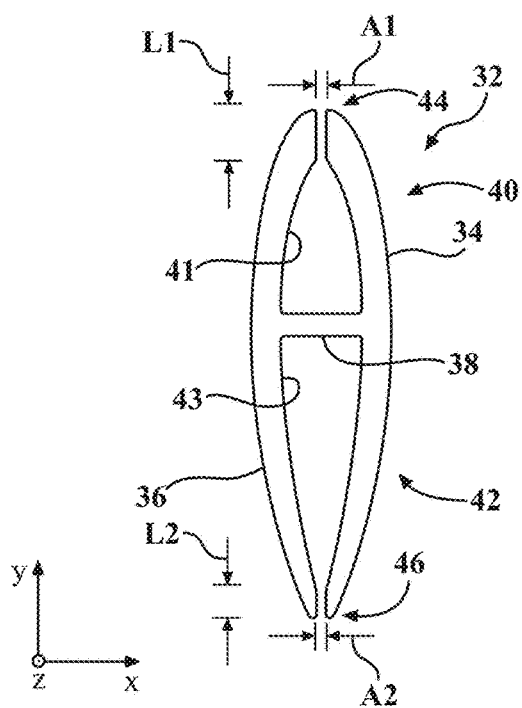
FIGS. 4A-4B are magnified cross-sectional views of a unit cell the line of FIG. 1 according to two aspects, with and without an acoustically absorbing medium.

FIG. 4A is a magnified cross-section view of an exemplary fin 32 of FIG. 1 according to various aspects. Each fin 32 includes at least one enclosure wall, although the fin 32 is shown as having multiple enclosure walls, such as first and second opposing side walls 34, 36, and an interior partition wall 38 that separates the interior of the fin 32. The various enclosure walls 34, 36, and interior partition walls 38 are typically formed of a solid, sound reflecting material. In general, the material or materials of which the enclosure walls 34, 36, and interior partition walls 38 are formed will have acoustic impedance higher than that of ambient fluid; the material will also be thermally conductive. Non-limiting examples of such materials can include a metal or composite. In various aspects, the fin 32 may include a base material that is thermally conductive and another material encapsulating or coating at least a portion of the base metal, such as a thermoplastic resin, polyurethane, or any other suitable material that may provide increased acoustic absorption capabilities.

As shown in FIG. 4A, the fin 32 can include a lossy resonator 40 providing a first chamber portion 41 with a first chamber volume $V_1$, and a lossless resonator 42 providing a second chamber portion 43 with a second chamber volume $V_2$. Generally, the lossy resonators 40 are directed toward the noise source. Each fin 32 further includes a first longitudinal neck 44, having a length $L_1$ and defining an aperture having a dimension $A_1$ that, when multiplied by a height dimension of the unit cell (in the z direction), defines an area $S_1$ that provides fluid communication between the first chamber portion 41 and an ambient environment (external of the unit cell); and a second longitudinal neck 46 having a length $L_2$ and defining an aperture having a dimension $A_2$ to define an area $S_2$ that provides fluid communication between the second chamber portion 43 and the ambient environment. Acoustic energy is absorbed in the necks 44, 46 due to the viscous friction. In various aspects, the length $L_1$ dimension of the first neck 44 of the lossy resonator 40 is greater than the length $L_2$ dimension of the lossless resonator 42.

The chamber volumes $V_1$, $V_2$ correspond to a volume of ambient fluid (generally air) that can be held in the respective chamber portions 41, 43, exclusive of the respective necks 44, 46. In various aspects, the lossless resonator 42 second chamber volume $V_2$ is greater than the lossy resonator 40 first chamber volume $V_1$. The magnitude of the variance of the chamber volumes $V_1$, $V_2$ and the neck lengths $L_1$, $L_2$ is generally determined by the desired frequency of the resonators 40, 42. For example, it is desirable that the resonators 40, 42 within the fin 32 each have the same resonance frequency. The variables that affect the resonance frequency are the respective neck length, L, cavity volume, V, and neck area, S, through the relationship of determined by Equation (1) as follows:

$$f = \frac{c}{2\pi}\sqrt{\frac{S}{VL}} \qquad \text{Equation (1)}$$

For the remaining variables, f is the resonance frequency of the Helmholtz resonator, and c is the speed of sound in the ambient fluid, neither of which change based on the structural design of the unit cell. In various aspects, the resonance frequency of the unit cell absorbers, or fins, may be targeted to the tonal resonances of any fan, plus the heat sink assembly and/or the operational (i.e., blade passing) frequency of the fan.

Figure 4B:
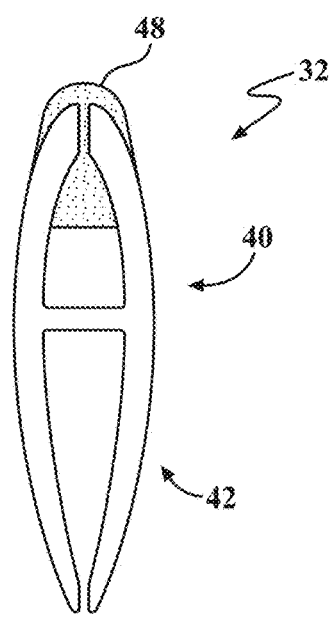

FIG. 4B illustrates the fin 32 of FIG. 4A additionally with an optional acoustically absorbing medium 48, such as a foam component. In various aspects, the acoustically absorbing medium 48 can be overlaying and/or partially filling the lossy resonator 40. In the example of FIG. 4B, the acoustically absorbing medium 48 overlays and at least partially covers an outer area adjacent to the first neck 44, and contiguously fills the longitudinal neck 44, as described above, and also fills an adjacent portion, or fraction, of the first chamber 41. In various aspects, the acoustically absorbing medium 48 can be a highly absorptive porous medium, such as a melamine or polyurethane foam, or any other medium having thermal dissipative acoustic properties. In some implementations, the acoustically absorbing medium 48 can have a porosity greater than 0.5, or 0.6, or 0.7, or 0.8, or 0.9.

With particular reference to FIGS. 1-3, the fins 32 can be periodic in 2-dimensions (e.g. the x, y dimensions of FIGS. 1-3). In this exemplary arrangement, the periodic array of the fins 32 has periodicity in both x and y dimensions. This can be termed a two-dimensional array. The plurality of sparsely-arranged fins 32 shaped as two-sided Helmholtz unit cells are positioned in a circular pattern with the first necks 44 of the lossy resonators 40 directed to a source of acoustic energy, for example, from an air circulation device. With particular reference to FIG. 3, the period, P, of the periodic array of fins 32 will generally be substantially smaller than the wavelength of the acoustic waves that the sparse acoustic absorber is designed to absorb. As shown in FIG. 3, the period, P, can be equated to a center-to-center distance between adjacent unit cells. In different implementations, the period of the periodic array of fins 32 will be within a range of from about 0.1 to about 0.75, inclusive, of the wavelength of the acoustic waves that the broadband sparse acoustic absorber is designed to absorb, i.e., the wavelength corresponding to the resonance frequency. In certain particular implementations, the period of the periodic array of fins 32 will be within a range of from about 0.25 to about 0.5 of the resonance wavelength. For example, in some implementations, the assembly 30 can be designed to absorb acoustic waves of a human-audible frequency, having a wavelength within a range of from about 17 mm to about 17 m, or some intermediate value contained within this range.

With continued reference to FIG. 3, each fin 32 of the periodic array of fins will generally have a maximum lateral dimension, or width W. The periodic distance, P, is preferably greater than a maximum lateral width dimension, W, of each fin 32. The periodic array of fins 32 is further characterized by a fill factor equal to W/P. In general, the fill factor will be 0.5 or less. In some implementations, the fill factor will be 0.25 (i.e., 25%) or less. It will be appreciated that the frequency breadth of efficient absorption of the assembly 30 (i.e., the broadband nature of absorption) is substantially determined by the fill factor of the periodic array of fins 32; the ratio of width, W, to period, P, of the fins 32. Thus, a large fill factor (W/P) increases the frequency bandwidth, whereas small fill factor (high sparsity) decreases the bandwidth of efficient absorption. As noted above, the period, P, of the periodic array of fins 32 is smaller than the wavelength corresponding to the desired resonance frequency (period<wavelength). At the same time, in many implementations the period, P, and width, W, of fins 32 will be chosen so that the periodic array of unit cells 32 has a fill factor of at least 0.2 (i.e. 20%).

Figure 5:
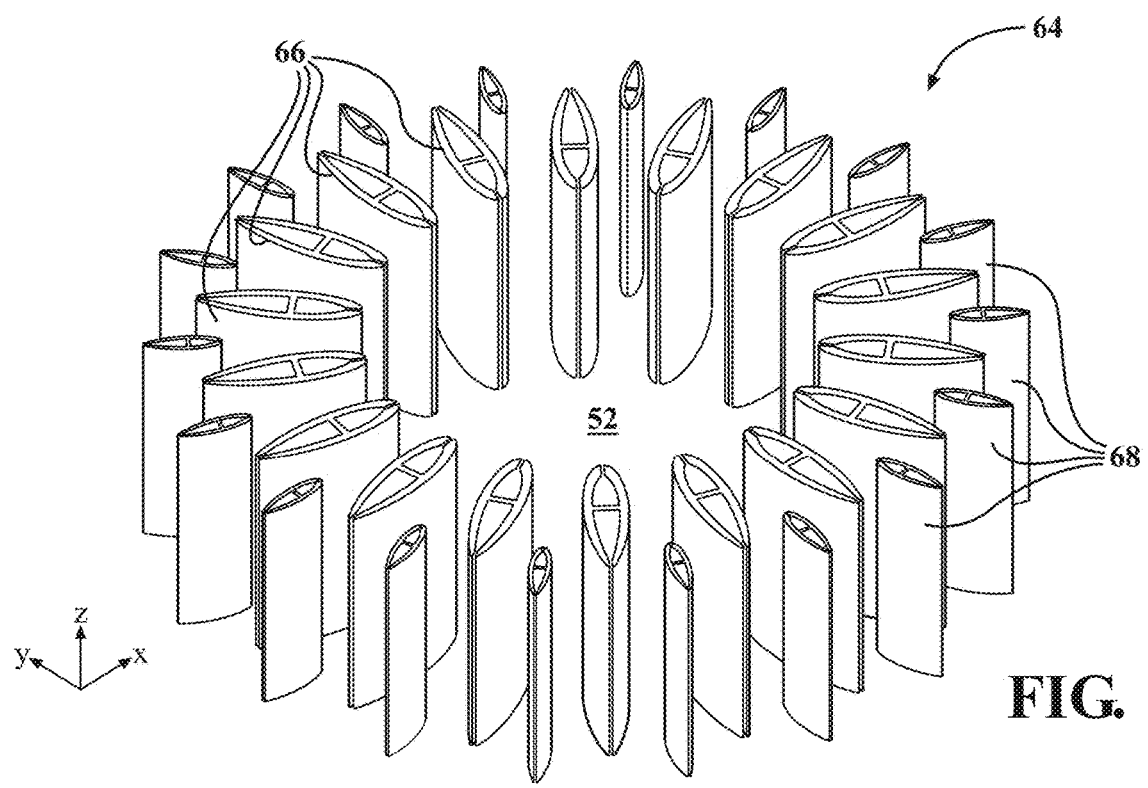
FIG. 5 is a top perspective view of an exemplary heat sink including two arrays of broadband sparse acoustic absorbers.
Figure 6:
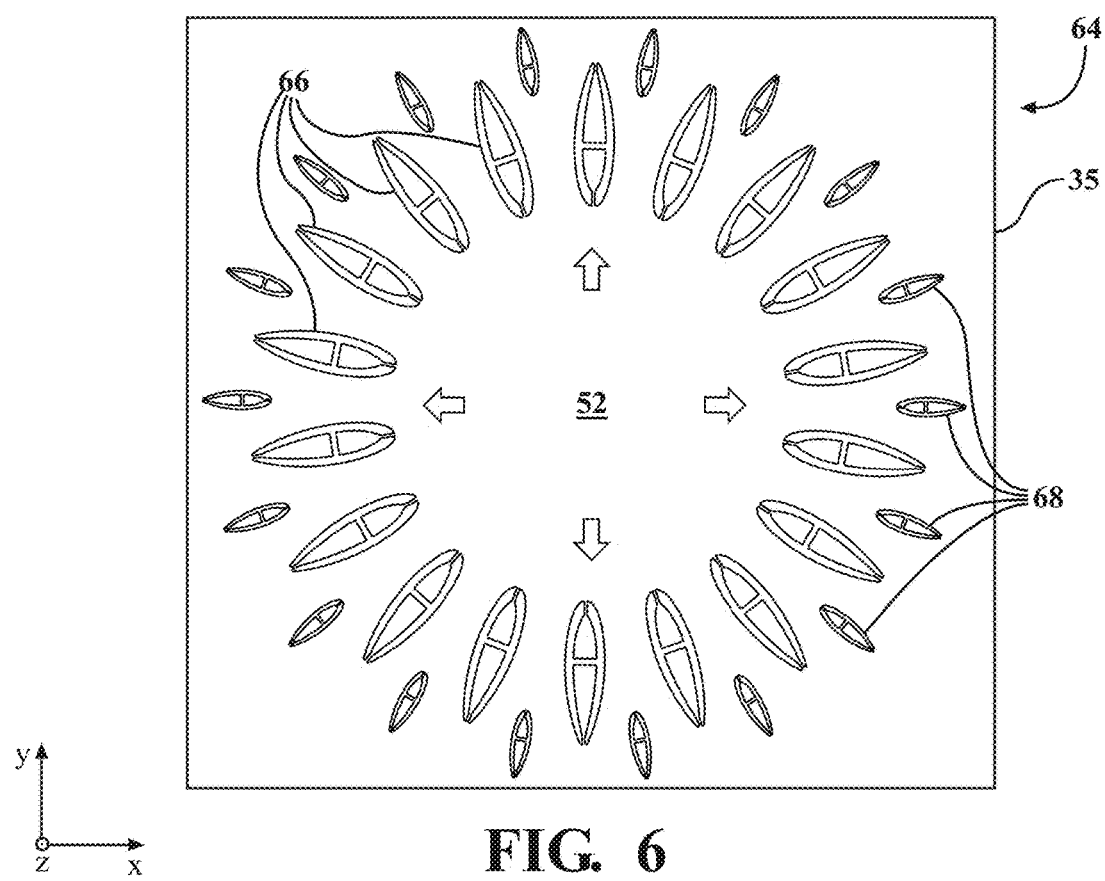
FIG. 6 is a top plan view of FIG. 5.

FIG. 5 is a top perspective view of another aspect of a thermal management assembly 64 including two sets, or arrays, of fins 32 configured as broadband sparse acoustic absorbers to create what may be referred to as a stacked or layered broadband sparse acoustic absorber in order to increase breadth of absorption. FIG. 6 is a top plan view of FIG. 5. The arrows in FIG. 6 indicate a direction of airflow as well as acoustic energy. As a non-limiting example, this flow field may be generated using a circular impinging air jet directed toward the heat sink base component 35. As shown, first and second sets of a plurality of fins 66, 68 are again designed as sparsely-arranged two-sided Helmholtz unit cells and are provided in a concentric ring arrangement, for example, with each ring provided to absorb a different frequency. The innermost plurality of fins 66 are shown having a larger size, and may be designed for a low frequency. The outermost plurality of fins 68 are shown smaller in size relative to the innermost plurality of fins 66, and may be designed for an intermediate, or higher frequency. In an alternate aspect (not specifically shown), the placement of the different sized fins can be reversed, such that the smaller fins 68 are located closest to the airflow from an air circulation device, and the larger fins 66 are disposed around the smaller fins 68. In the various aspects, the sets or arrays of the plurality of fins 66, 68 are generally arranged in a staggered relationship, such that they are not directly blocking one another from the acoustic energy and airflow. It should be understood that while the figures illustrate the sets of fins 66, 68 generally having the same geometries, other aspects may provide multiple sets or arrays of fins with one or more different geometries, different geometries, and/or different properties.

Figure 7:
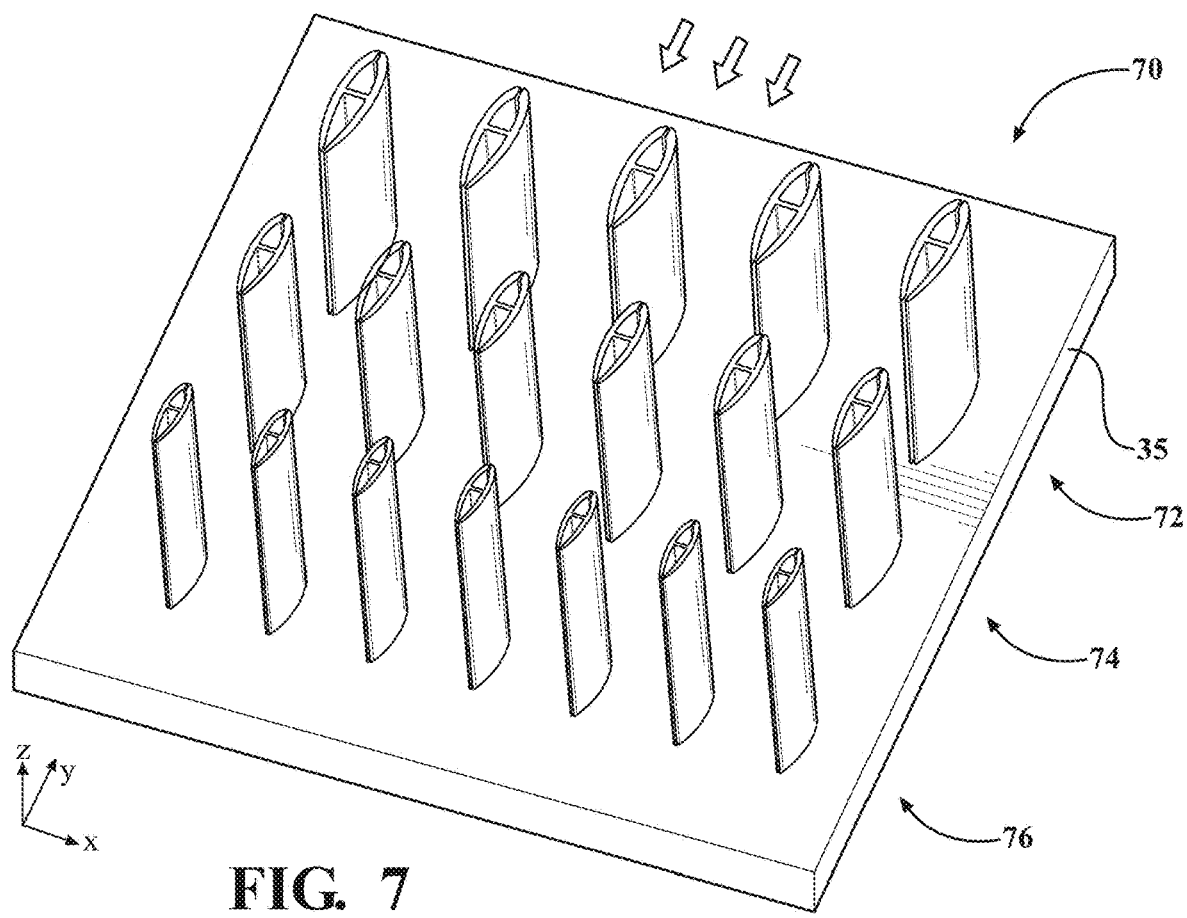
FIG. 7 is a top perspective view of a portion of a plurality of arrays of broadband sparse acoustic absorbers of different sizes that may be placed adjacent an air circulation device.
Figure 8:
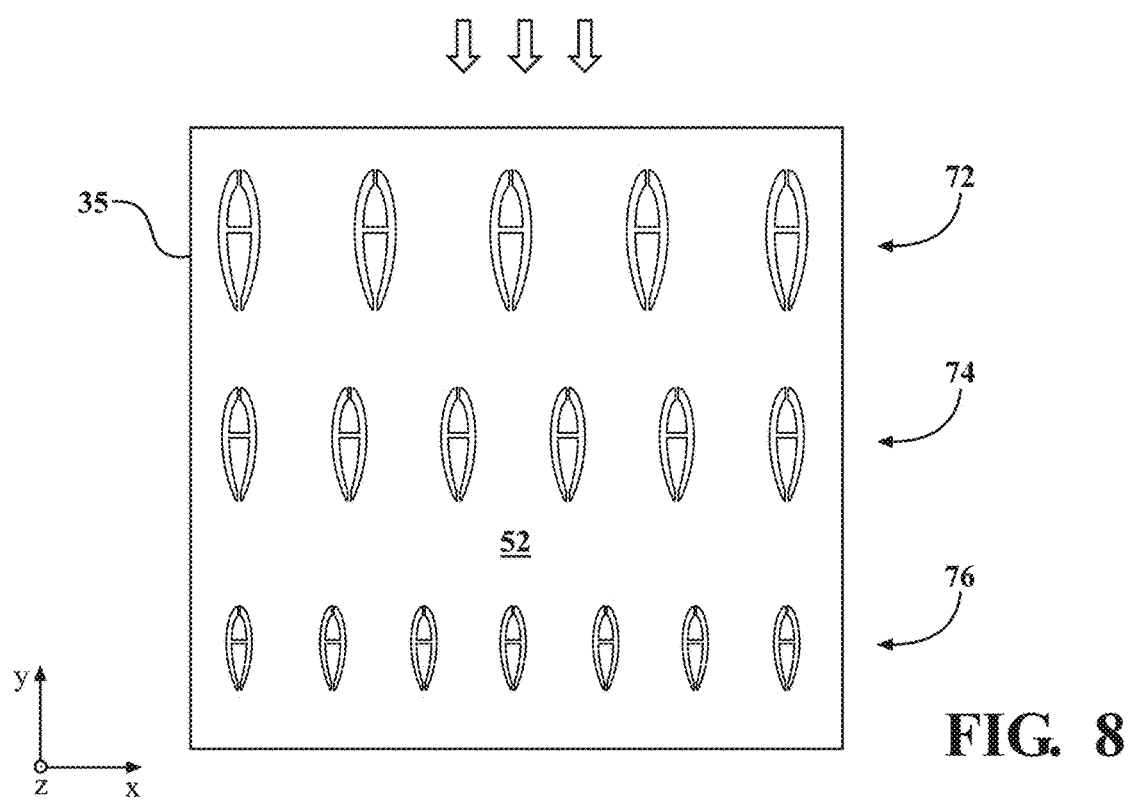
FIG. 8 is a top plan view of FIG. 7.

FIG. 7 is a top perspective view of another aspect of the present technology, showing a portion of an assembly 70 of three layered arrays 72 (low frequency), 74 (intermediate frequency), 76 (high frequency) of a plurality of fins designed as broadband sparse acoustic absorbers of different sizes that may be placed adjacent an air circulation device (not shown). FIG. 8 is a top plan view of FIG. 7. The arrows in FIGS. 7-8 indicate a direction of airflow as well as acoustic energy. As a non-limiting example, this flow field may be generated using a fan oriented to flow air across the base component 35 of the heat sink assembly 70. Although the layered arrays 72, 74, 76 are aligned in a linear format, other arrangements, such as curved or circular arrays may be used. Similarly, It should be understood that while the figures illustrate the arrays 72, 74, 76 of fins generally having the same geometries, other aspects may provide multiple sets or arrays of fins with one or more different geometries, different geometries, and/or different properties.

Figure 9:
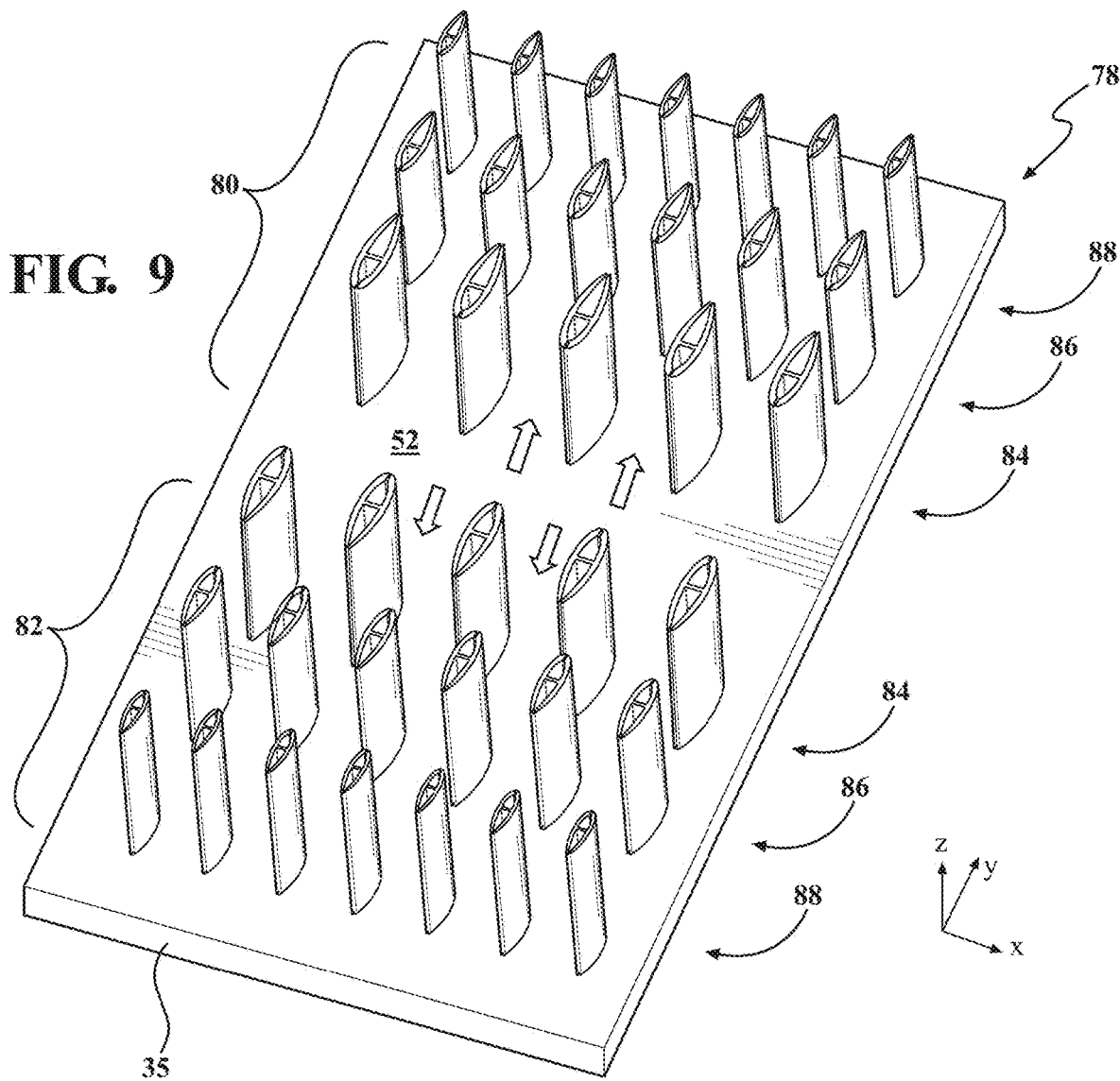
FIG. 9 is a top perspective view of a portion of two sets of a plurality of arrays of broadband sparse acoustic absorbers of different sizes that may be placed adjacent an air circulation device.
Figure 10:
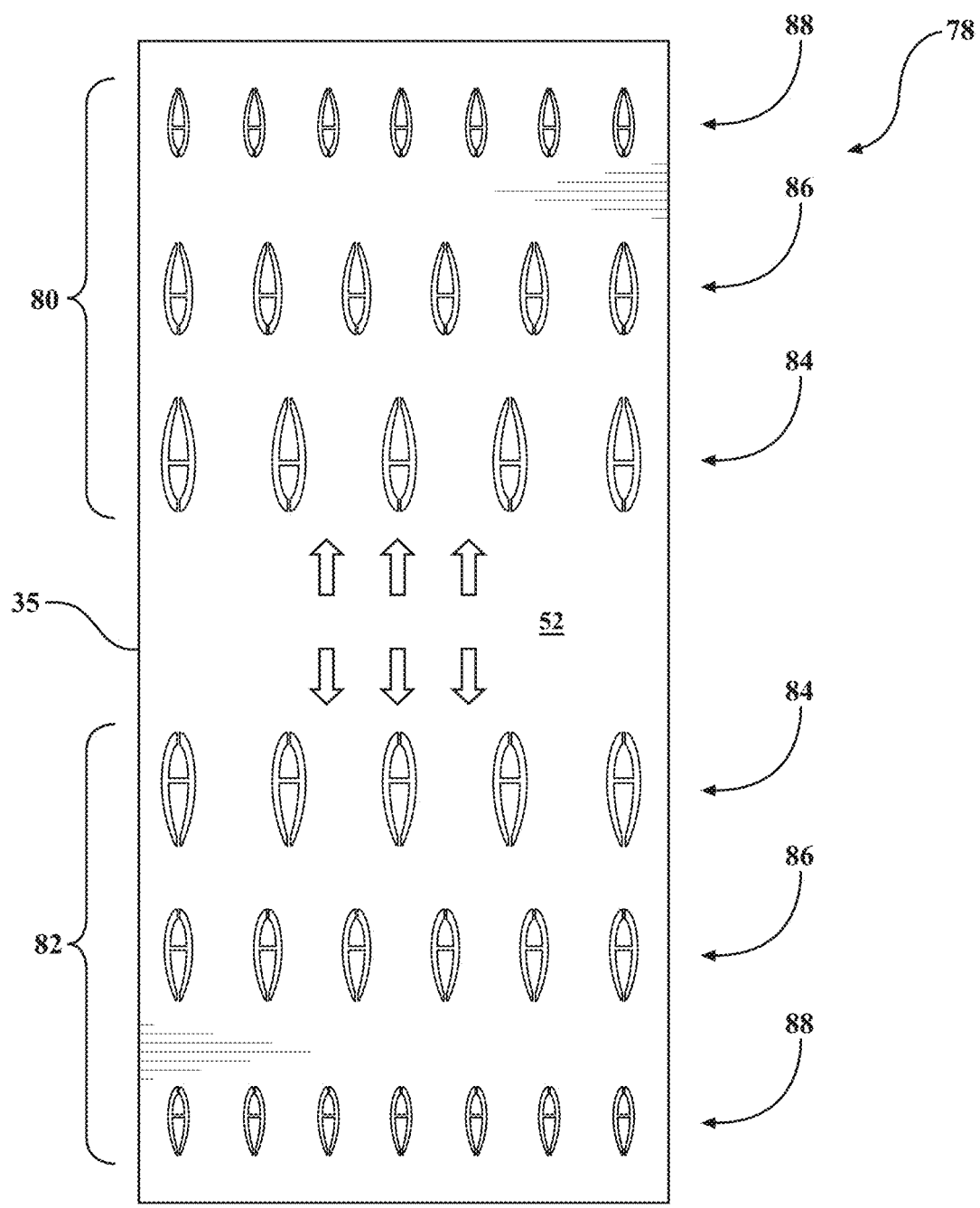
FIG. 10 is a top plan view of FIG. 9.

FIG. 9 is a top perspective view of another aspect of the present technology, showing a portion of an assembly 78 of two groupings 80, 82 of three layered arrays 84 (low frequency), 86 (intermediate frequency), 88 (high frequency) of a plurality of fins designed as broadband sparse acoustic absorbers of different sizes that may be placed on opposing sides of an air circulation device (not shown). FIG. 10 is a top plan view of FIG. 9. The arrows in FIGS. 9-10 indicate a direction of airflow as well as acoustic energy. As a non-limiting example, this flow field may be generated using air flow configured into a rectangular slot jet and impinging on to the base component 35 of the heat sink assembly 78. Although the layered arrays 84, 86, 88 are aligned in a linear format, other arrangements, such as curved or circular arrays may be used. Similarly, It should be understood that while the figures illustrate the arrays 84, 86, 88 of fins generally having the same geometries, other aspects may provide multiple sets or arrays of unit cells with one or more different geometries, different geometries, and/or different properties.

While the fins/unit cells of FIGS. 1-10 are generally shown as having the first boundary wall 34 and the second boundary wall 36 cooperating to form a fin 32 having a cross-section defining a substantially ovoid or elongated oval shape/profile, with the first neck 44 and the second neck 46 disposed at opposing ends of the unit cells, other shapes are also contemplated. For example, the fins can alternately have a cross-sectional profile that is non-square rectangular, circular, triangular, diamond, prismatic cylindrical, conical, spherical, equilateral parallelograms, or any other shape that is suitable to enclose first and second Helmholtz resonators 40, 42 separated by at least one partition wall 38, or the like. In various aspects where the periodic array of fins 32 is a two-dimensional array, the two-dimensional array can have 90° rotational symmetry about an axis perpendicular to the surface of the base component 35.

FIG. 11 provides an array 90 of fins 92 having a non-square rectangular cross-sectional profile according to a first aspect. Functionally, the fins 92 of FIG. 11 are similar to the fins 32 previously described above, and can be used in the designs of the sound suppression systems and assemblies already discussed. FIG. 12A is a cross-sectional view of the fin 92, and illustrates an exemplary arrangement of boundary walls 94, 96 and a partition wall 98 that cooperate to define two resonators having first and second necks 100, 102. FIG. 12B is a cross-sectional view of the fin 92 including an optional acoustically absorbing medium 48 at least partially covering an outer area adjacent to the first neck 100 and contiguously filling the first neck 100 and a fraction of the first chamber.

Figure 13:
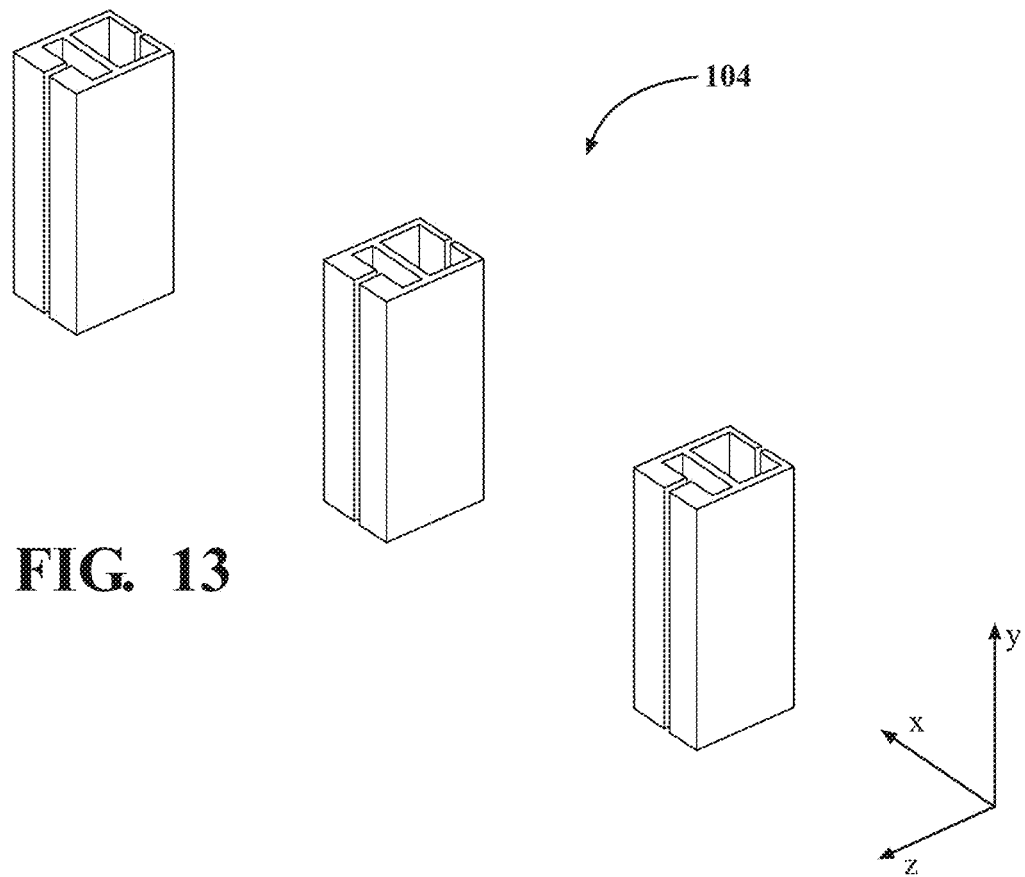
FIG. 13 illustrates a plurality of unit cells having a second alternate geometric design.
Figure 14A:
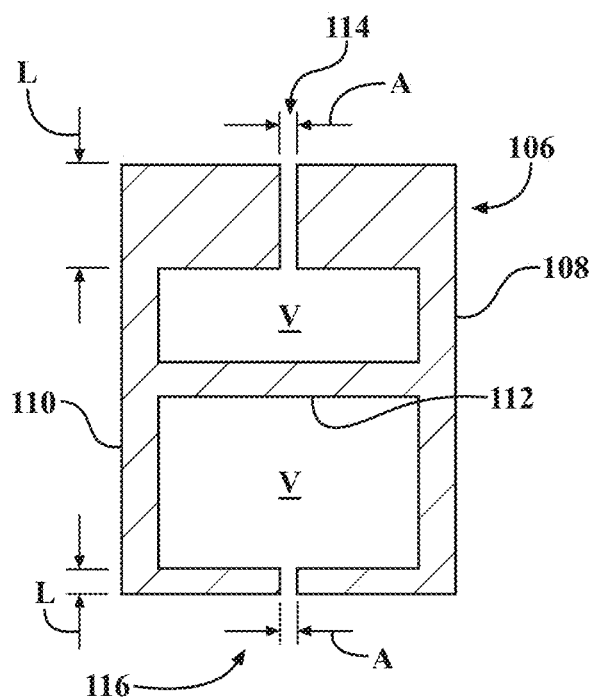
FIGS. 14A-14B are magnified cross-section views of a unit cell of FIG. 13 according to two aspects, with and without an acoustically absorbing medium.
Figure 14B:
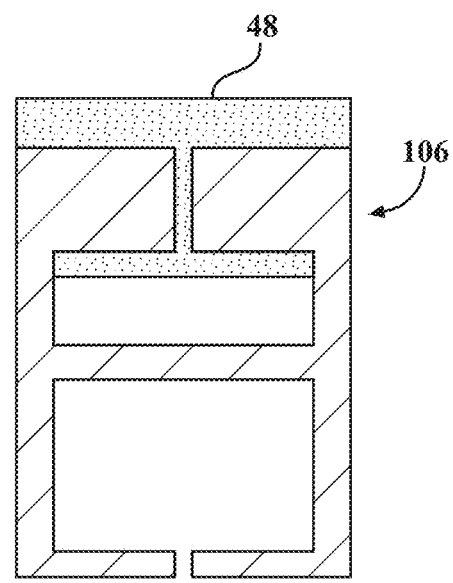

FIG. 13 provides an array 104 of fins 106 having a non-square rectangular cross-sectional profile according to a second aspect. Functionally, the fins 106 of FIG. 13 are also similar to the fins 32 previously described above, and can be used in the designs of the sound suppression systems and assemblies already discussed. FIG. 14A is a cross-sectional view of the fin 106, and illustrates an exemplary arrangement of boundary walls 108, 110 and a partition wall 112 that cooperate to define two resonators having first and second necks 114, 116. FIG. 14B is a cross-sectional view of the fin 106 including an optional acoustically absorbing medium 48 at least partially covering an outer area adjacent to the first neck 114 and contiguously filling the first neck 114 and a fraction of the first chamber.

Figure 15:
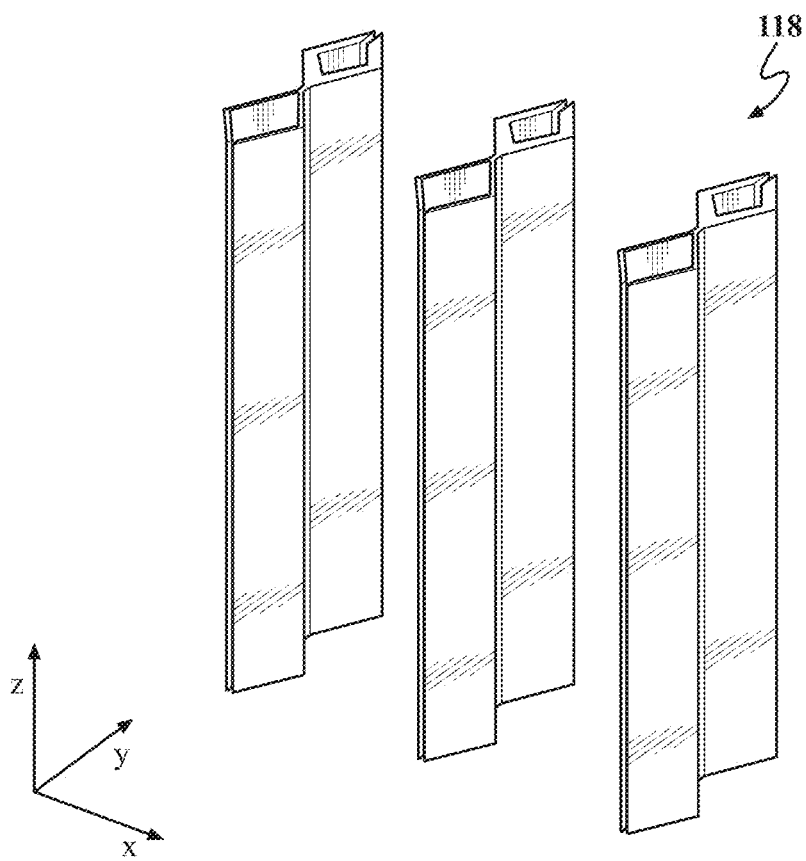
FIG. 15 illustrates a plurality of unit cells having a third alternate geometric design.
Figures 16A, 16B:
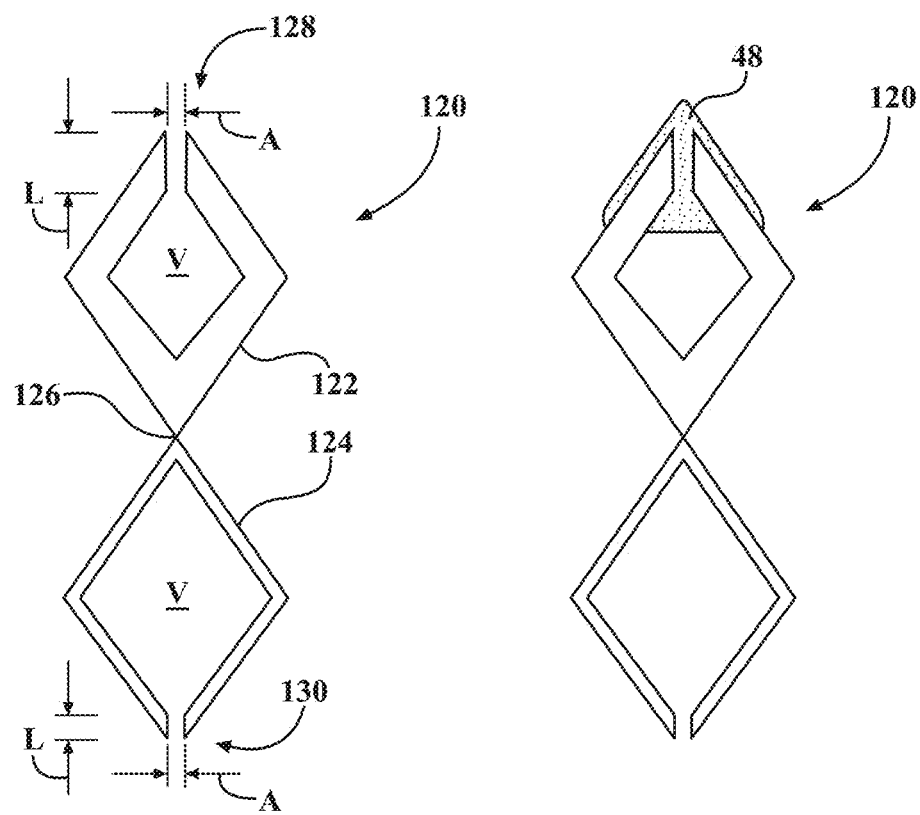
FIGS. 16A-16B are magnified cross-section views of a unit cell of FIG. 15 according to two aspects, with and without a sound absorbing foam.

FIG. 15 provides an array 118 of fins 120 having a cross-sectional profile with two equilateral parallelograms, which are shown having a substantially diamond pattern. Functionally, the fins 120 of FIG. 15 are also similar to the fins 32 previously described above, and can be used in the designs of the sound suppression systems and assemblies already discussed. FIG. 16A is a cross-sectional view of the fin 120, and illustrates an exemplary arrangement of boundary walls 122, 124 and a partition wall, or portion 126 that cooperate to define two resonators having first and second necks 128, 130. FIG. 16B is a cross-sectional view of the fin 120 including an optional acoustically absorbing medium 48 at least partially covering an outer area adjacent to the first neck 128 and contiguously filling the first neck 128 and a fraction of the first chamber.

Figure 17:
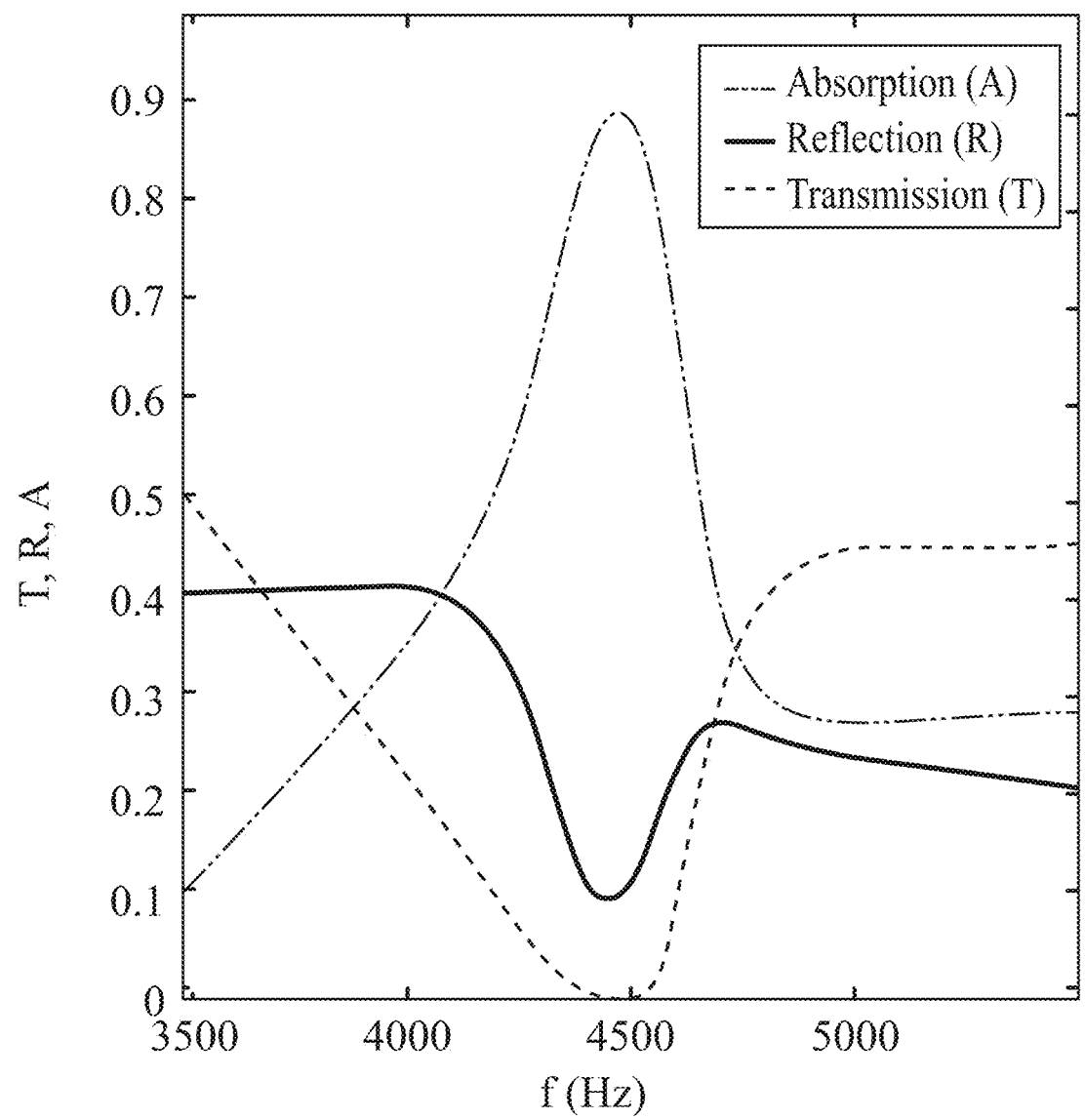
FIG. 17 is a graph of acoustic absorption, reflection, and transmission as a function of frequency for the assembly of FIGS. 1-3.

FIG. 17 is a graph of acoustic absorption, reflection, and transmission as a function of frequency for the assembly 30 of FIGS. 1-3, illustrating the high acoustic absorption of about 90% at a frequency of about 4500 Hz.

Figure 18:
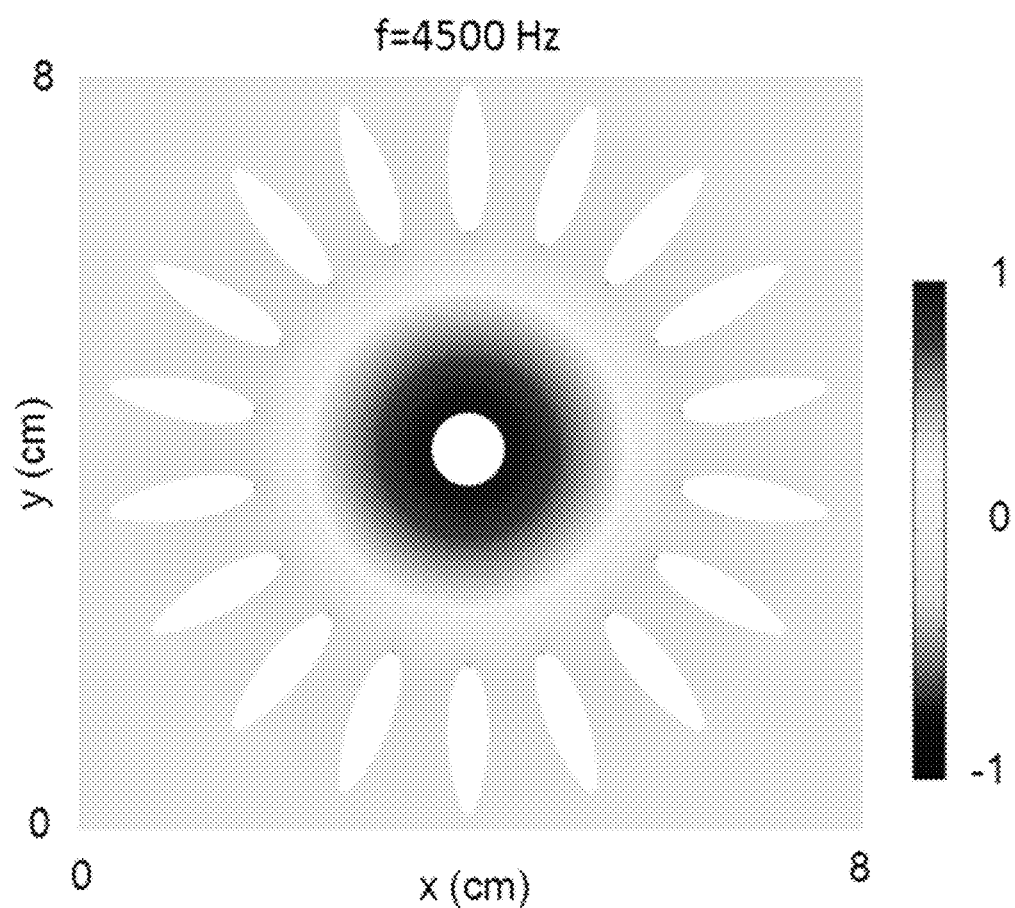
FIG. 18 illustrates a pressure field of the broadband sparse acoustic absorber of the type shown in FIGS. 1-3 at a frequency of 4500 Hz.

FIG. 18 illustrates a pressure field of the broadband sparse acoustic absorber of the type shown in FIGS. 1-3 at a frequency of 4500 Hz. A high pressure region is placed between the resonator array and the center of the array, where the acoustic noise source (i.e., the fan) is located.

In still other aspects, the present teachings provide a method of removing heat from a heat generating device and at the same time suppressing sound from an air circulation device. Referring generally to FIGS. 1-3, one exemplary includes positioning a heat sink base component 35 adjacent a heat generating device 54. The heat sink includes a base component 35 with a plurality of thermally conductive fins 32 extending therefrom in a sparsely-arranged periodic array. Each fin 32 is designed as a two-sided Helmholtz unit cell that includes a lossy resonator 40 directed to a source of acoustic energy from the air circulation device, and a lossless resonator 42. The lossy resonator 40 includes a first chamber portion 41 bounded by at least one first boundary wall 34 defining a first chamber volume $V_1$, and a first neck 44 forming an opening in the first chamber portion 41. The first neck 44 provides fluid communication between the first chamber portion 41 and an ambient environment. The lossless resonator 42 includes a second chamber portion 43 bounded by at least one second boundary wall 36 defining a second chamber volume $V_2$, and a second neck 46 forming an opening in the second chamber portion 43. The second neck 46 provides fluid communication between the second chamber portion 43 and the ambient environment. The method includes directing an airflow, for example, from an air circulation device, to the respective first necks 44 of the lossy resonators 40 to remove heat from the heat generating device and absorb acoustic energy from the air circulation device. In various aspects, the fins 32 may be disposed in an annular periodic array, and directing the airflow from the air circulation device to the respective first necks 44 of the lossy resonators 40 includes aligning an airflow from a fan with the heat sink. In other aspects, multiple sets of pluralities of fins 32 may be provided, for example, having different resonance frequencies. As disclosed herein, various geometries of the fins 32 can be used with the methods.

The preceding description is merely illustrative in nature and is in no way intended to limit the disclosure, its application, or uses. As used herein, the phrase at least one of A, B, and C should be construed to mean a logical (A or B or C), using a non-exclusive logical "or." It should be understood that the various steps within a method may be executed in different order without altering the principles of the present disclosure. Disclosure of ranges includes disclosure of all ranges and subdivided ranges within the entire range.

The headings (such as "Background" and "Summary") and sub-headings used herein are intended only for general organization of topics within the present disclosure, and are not intended to limit the disclosure of the technology or any aspect thereof. The recitation of multiple embodiments having stated features is not intended to exclude other embodiments having additional features, or other embodiments incorporating different combinations of the stated features.

As used herein, the terms "comprise" and "include" and their variants are intended to be non-limiting, such that recitation of items in succession or a list is not to the exclusion of other like items that may also be useful in the devices and methods of this technology. Similarly, the terms "can" and "may" and their variants are intended to be non-limiting, such that recitation that an embodiment can or may comprise certain elements or features does not exclude other embodiments of the present technology that do not contain those elements or features.

The broad teachings of the present disclosure can be implemented in a variety of forms. Therefore, while this disclosure includes particular examples, the true scope of the disclosure should not be so limited since other modifications will become apparent to the skilled practitioner upon a study of the specification and the following claims. Reference herein to one aspect, or various aspects means that a particular feature, structure, or characteristic described in connection with an embodiment or particular system is included in at least one embodiment or aspect. The appearances of the phrase "in one aspect" (or variations thereof) are not necessarily referring to the same aspect or embodiment. It should be also understood that the various method steps discussed herein do not have to be carried out in the same order as depicted, and not each method step is required in each aspect or embodiment.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations should not be regarded as a departure from the disclosure, and all such modifications are intended to be included within the scope of the disclosure.

What is claimed is:

1. A thermal management assembly for removing heat and absorbing acoustic energy, the thermal management assembly comprising:
   a heat sink base component; and
   a plurality of thermally conductive fins disposed in a sparsely-arranged periodic array in thermal communication with, and extending from, the heat sink base component, each fin defining a two-sided Helmholtz unit cell that comprises:
   a lossy resonator having:
      a first chamber portion bounded by at least one first boundary wall defining a first chamber volume; and a first neck forming an opening in the first chamber portion and providing fluid communication between the first chamber portion and an ambient environment; and a lossless resonator having:
 a second chamber portion bounded by at least one second boundary wall defining a second chamber volume; and
 a second neck forming an opening in the second chamber portion and providing fluid communication between the second chamber portion and the ambient environment.

2. The thermal management assembly according to claim 1, wherein the heat sink base component defines first and second opposing major surfaces, the first major surface being provided in thermal communication with a heat generating device, and the second major surface being coupled with the plurality of fins.

3. The thermal management assembly according to claim wherein the heat generating device comprises an electronics component.

4. The thermal management assembly according to claim 2, wherein the sparsely-arranged periodic array is positioned in an annular pattern, with the first necks of the lossy resonators directed toward a center of the sparsely-arranged periodic array.

5. The thermal management assembly according to claim 1, wherein the fins are spaced apart by a center-to-center periodic distance, P, wherein the periodic distance, P, is greater than a maximum lateral width dimension, W, of each unit cell.

6. The thermal management assembly according to claim 5, wherein the sparsely-arranged period array is characterized by a fill factor equal to W/P, and wherein the fill factor is 0.5 or less.

7. The thermal management assembly according to claim 1, wherein within each fin, the second chamber volume is greater than the first chamber volume, a length of the first neck is greater than a length of the second neck, and the lossy resonator and the lossless resonator have the same resonance frequency.

8. The thermal management assembly according to claim 1, wherein the heat sink base component and the plurality of fins are formed as a unitary, monolithic component.

9. The thermal management assembly according to claim 1, comprising first and second sets of a plurality of fins, wherein:
 the first set of the plurality of fins is disposed in a first annular periodic array, and configured with a first frequency;
 the second set of the plurality of fins is disposed in a second annular periodic array, surrounding the first annular periodic array, and configured with a second frequency different from the first frequency;
 the first necks of the lossy resonators are directed toward a common center of the first and second sets of the plurality of fins; and
 the first and second sets of the plurality of fins are arranged in a staggered relationship.

10. The thermal management assembly according to claim 1, wherein the fins are aligned in a plurality of sparsely-arranged linear rows, wherein each row is configured for absorbing acoustic energy of a different frequency, and wherein the sparsely-arranged linear rows are arranged in a staggered relationship.

11. The thermal management assembly according to claim 1, wherein within each fin, the first boundary wall, the second boundary wall, and an interior partition wall cooperate to form a unit cell having a cross-section defining an elongated oval shape enclosing the lossy resonator and the lossless resonator with the lossy resonator and the lossless resonator separated by the interior partition wall, and the first neck and the second neck disposed at opposing ends.

12. The thermal management assembly according to claim 1, wherein the first boundary wall, the second boundary wall, and an interior partition wall cooperate to form a unit cell having a cross-section defining a non-square, rectangular shape enclosing the lossy resonator and the lossless resonator with the lossy resonator and the lossless resonator separated by the interior partition wall.

13. The thermal management assembly according to claim 1, wherein the first boundary wall and the second boundary wall cooperate to form a unit cell having a cross-section defining two equilateral parallelograms with the first neck and the second neck disposed at opposing ends.

14. A thermal management assembly for removing heat and absorbing acoustic energy, the thermal management assembly comprising:
 a heat sink base component defining first and second opposing major surfaces;
 a heat generating device in thermal communication with the first major surface; and
 a plurality of thermally conductive fins disposed in a sparsely-arranged periodic array and in thermal communication with the heat sink base component and extending from the second major surface of the heat sink base component, each fin defining a two-sided Helmholtz unit cell that comprises:
  a lossy resonator having:
   a first chamber portion bounded by at least one first boundary wall defining a first chamber volume; and
   a first neck forming an opening in the first chamber portion and providing fluid communication between the first chamber portion and an ambient environment; and
  a lossless resonator having:
   a second chamber portion bounded by at least one second boundary wall defining a second chamber volume; and
   a second neck forming an opening in the second chamber portion and providing fluid communication between the second chamber portion and the ambient environment.

15. The thermal management assembly according to claim 14, wherein the fins are positioned in an annular pattern, with the first necks of the lossy resonators directed toward a center of the sparsely-arranged periodic array.

16. The thermal management assembly according to claim 14, wherein the heat sink base component and the plurality of tins are formed as a unitary, monolithic component.

17. The thermal management assembly according to claim 14, wherein the fins are aligned in a plurality of sparsely-arranged linear rows. wherein each row is configured for absorbing acoustic energy of a different frequency, and wherein the sparsely-arranged linear rows are arranged in a staggered relationship.

18. The thermal management assembly according to claim 14, wherein within each fin, the first boundary wall, the second boundary wall, and an interior partition wall cooperate to form a unit cell having a cross-section defining an elongated oval shape enclosing the lossy resonator and the lossless resonator with the lossy resonator and the lossless resonator separated by the interior partition wall, and the first neck and the second neck disposed at opposing ends.

19. A method of removing heat from a heat generating device and suppressing sound from an air circulation device, the method comprising:
   positioning a heat sink adjacent a heat generating device, the heat sink including a base component with a plurality of thermally conductive fins extending therefrom in a sparsely-arranged periodic array, wherein each fin comprises a two-sided Helmholtz unit cell that comprises:
      a lossy resonator having:
         a first chamber portion bounded by at least one first boundary wall defining a first chamber volume; and
         a first neck forming an opening in the first chamber portion providing fluid communication between the first chamber portion and an ambient environment; and
      a lossless resonator having:
         a second chamber portion bounded by at least one second boundary wall defining a second chamber volume; and
         a second neck forming an opening in the second chamber portion and providing fluid communication between the second chamber portion and the ambient environment; and
   directing an airflow from the air circulation device to the respective first necks of the lossy resonators to remove heat from the heat generating device and absorb acoustic energy from the air circulation device.

20. The method according to claim 19, wherein the fins are disposed in an annular periodic array, and directing the airflow from the air circulation device to the respective first necks of the lossy resonators comprises aligning an airflow from a fan with the heat sink.

* * * * *

UNITED STATES PATENT AND TRADEMARK OFFICE
CERTIFICATE OF CORRECTION

PATENT NO. : 11,204,204 B2
APPLICATION NO. : 16/296412
DATED : December 21, 2021
INVENTOR(S) : Taehwa Lee, Hideo Iizuka and Ercan Mehmet Dede It is certified that error appears in the above-identified patent and that said Letters Patent is hereby corrected as shown below:

In the Specification

Column 3, Line 8: delete "unit cell the line of FIG. 1" and insert --unit cell of FIG. 1--

Column 12, Line 54: delete "tins" and insert --fins--

Column 12, Line 58: delete "linear rows. wherein" and insert --linear rows, wherein--

Column 13, Line 17: delete "portion providing fluid communication" and insert --portion and providing fluid communication--

Signed and Sealed this
Fourteenth Day of June, 2022

Katherine Kelly Vidal
*Director of the United States Patent and Trademark Office*